(12) United States Patent
Kassir

(10) Patent No.: US 7,160,808 B2
(45) Date of Patent: Jan. 9, 2007

(54) CHUCK FOR SUPPORTING WAFERS WITH A FLUID

(75) Inventor: Salman M. Kassir, San Luis Obispo, CA (US)

(73) Assignee: Strasbaugh, San Luis Obispo, CA (US)

( * ) Notice: Subject to any disclaimer, the term of this patent is extended or adjusted under 35 U.S.C. 154(b) by 290 days.

(21) Appl. No.: 10/860,381

(22) Filed: Jun. 1, 2004

(65) Prior Publication Data

US 2005/0009349 A1    Jan. 13, 2005

Related U.S. Application Data

(63) Continuation-in-part of application No. 10/059,701, filed on Jan. 29, 2002, now Pat. No. 6,743,722.

(51) Int. Cl.
*C30B 25/12* (2006.01)
*C30B 25/14* (2006.01)

(52) U.S. Cl. .............. 438/690; 438/460; 438/748; 438/977

(58) Field of Classification Search .............. 438/460, 438/690, 748, 977
See application file for complete search history.

(56) References Cited

U.S. PATENT DOCUMENTS

| | | | |
|---|---|---|---|
| 3,841,031 A | 10/1974 | Walsh | 51/283 |
| 4,252,865 A | 2/1981 | Gilbert et al. | 428/611 |
| 4,343,662 A | 8/1982 | Gay | 148/147 |
| 4,557,785 A | 12/1985 | Ohkuma | 156/345 |
| 4,612,408 A | 9/1986 | Moddel et al. | |
| 5,113,622 A | 5/1992 | Nishiguchi et al. | 51/165.73 |
| 5,268,065 A | 12/1993 | Grupen-Shemansky | 156/630 |
| 5,277,769 A | 1/1994 | Medernach | 204/129.3 |
| 5,476,819 A | 12/1995 | Warren | 437/22 B |
| 5,693,182 A | 12/1997 | Mathuni | 156/645.1 |
| 5,695,557 A | 12/1997 | Yamagata et al. | 117/97 |
| 5,733,814 A | 3/1998 | Flesher et al. | 438/106 |
| 5,840,199 A | 11/1998 | Warren | 216/2 |
| 5,942,445 A | 8/1999 | Kato et al. | 438/691 |
| 6,026,830 A | 2/2000 | Huang | 134/66 |
| 6,099,662 A | 8/2000 | Wang et al. | 134/26 |
| 6,102,057 A | 8/2000 | Vogtmann et al. | 134/144 |
| 6,136,171 A | 10/2000 | Frazier et al. | |
| 6,149,759 A | 11/2000 | Guggenberger | 156/345 |
| 6,162,739 A | 12/2000 | Sumnitsch et al. | 438/745 |
| 6,169,038 B1 | 1/2001 | Kruwinus et al. | 438/745 |
| 6,187,605 B1 | 2/2001 | Takasu et al. | 438/29 |
| 6,224,668 B1 | 5/2001 | Tamatsuka | 117/84 |
| 6,248,661 B1 | 6/2001 | Chien et al. | 438/632 |
| 6,254,455 B1 * | 7/2001 | Irvine et al. | 451/28 |
| 6,268,237 B1 | 7/2001 | Flesher et al. | 438/106 |
| 6,335,269 B1 | 1/2002 | Sato | 438/509 |
| 6,337,027 B1 | 1/2002 | Humphrey | 216/2 |
| 2001/0039119 A1 | 11/2001 | Kishimoto | |
| 2002/0014661 A1 | 2/2002 | Okamoto | |

\* cited by examiner

*Primary Examiner*—Felisa Hiteshew
(74) *Attorney, Agent, or Firm*—K. David Crockett, Esq.; Crockett & Crockett

(57) ABSTRACT

A method of relieving surface stress on a thin wafer by removing a small portion of the wafer substrate, the substrate being removed by applying a warm solution of KOH to the backside of the wafer while the wafer spins. The wafer may be supported on a rotatable platform adapted to direct the flow of chilled, deionized water underneath the device side of the wafer. The chilled water supports the wafer and protects the devices built-up on the wafer from the corrosive effects of KOH and from thermal damage.

10 Claims, 6 Drawing Sheets

Fig. 9
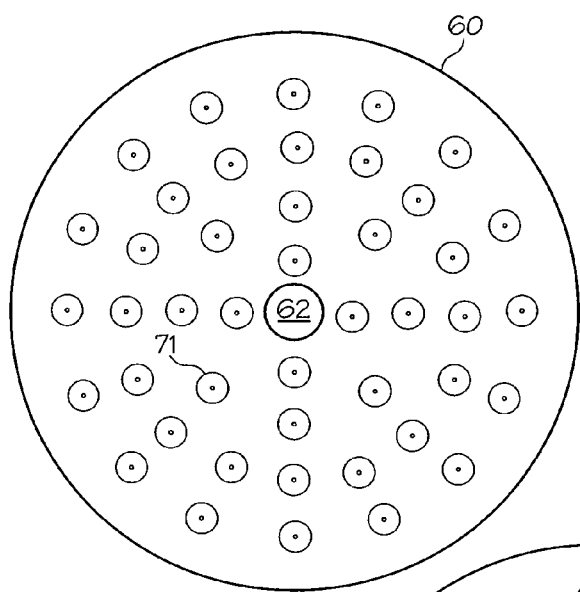
Fig. 10
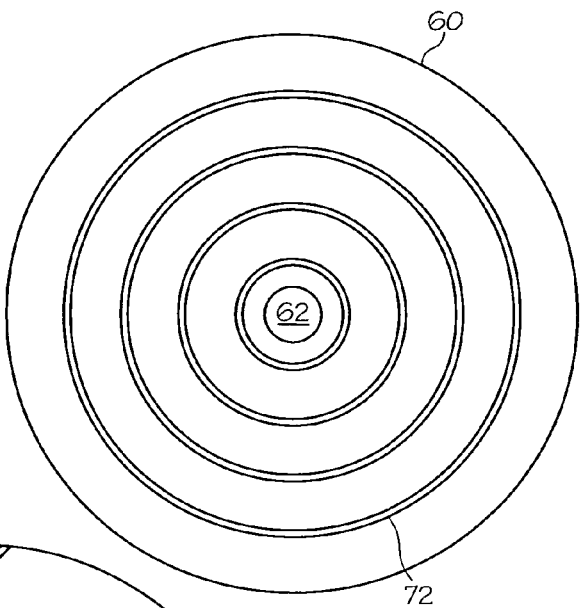
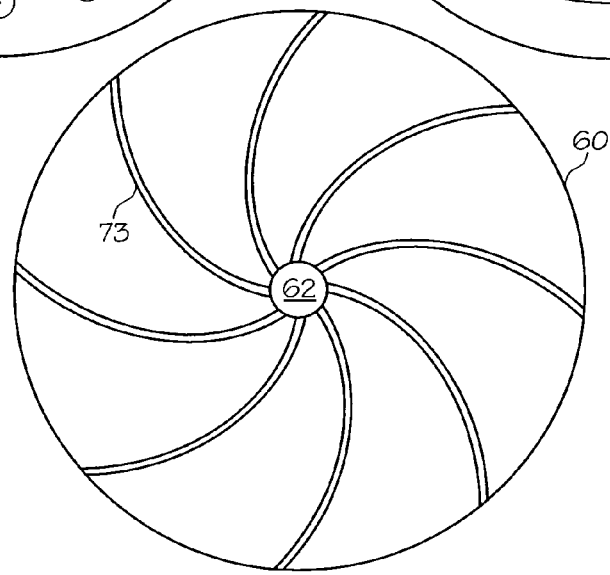
Fig. 11

CHUCK FOR SUPPORTING WAFERS WITH A FLUID

This application is a continuation-in-part of U.S. application Ser. No. 10/059,701, filed Jan. 29, 2002, now U.S. Pat. No. 6,743,722.

FIELD OF THE INVENTIONS

The methods and devices described below relate to the field of integrated circuit manufacture.

BACKGROUND OF THE INVENTIONS

To build an integrated circuit chip, a layer of selected materials is deposited on a silicon substrate using a variety of deposition techniques, including chemical vapor deposition, sputtering, ashing, and other techniques. Chemical mechanical planarization (CMP) usually is performed after depositing the layer. CMP provides smooth, planar topographies to semiconductor wafers and surfaces deposited on a semiconductor substrate, such as silicon, and is an integral part of making many types of integrated chips. The deposition and polishing steps are repeated as necessary to build a multi-layer integrated chip. For example, a layer of electrically conducting material is sputtered onto an etched substrate. The CMP process then is used to remove the layer until the electrically conducting material remains only in the etched areas. Subsequently, additional layers are added and then polished until the final product is achieved: many layers of integrated circuits on the built-up front side of the silicon substrate.

When building integrated chips it is important that the semiconductor substrate be very thin, as thin as 100 micrometers or even 75 micrometers (μm). To make the substrate as thin as possible, and to relieve stress caused during the deposition and CMP processes, the back of the wafer is ground to remove the bulk of the substrate. This process is known as backgrinding. However, stresses build up during the backgrinding process that tend to warp the wafer and make it vulnerable to breaking when the wafer is later cut into individual die. The stress is caused by small deformations on the surface of the substrate, typically grind lines, that arise from the physical force of grinding. In addition, the stress caused by backgrinding is exacerbated by internal stresses accumulated during the layer building process. Thus, it is important to relieve as much wafer stress as possible.

Currently, wafers are wet-etched with acid etchants to relieve stress after backgrinding. However, wet etching with acid poses four significant problems. First, the acid may damage the outer edge of the top layers of the wafer if the acid seeps through the protective means, such as backgrind tape, used protect the front side of the wafer. The damage can destroy integrated chips located around the edge of the wafer, thus reducing production efficiency. Second, using acids is inefficient. Wet etching with acids requires that the background wafers be transferred to a separate machine built to withstand the acids. The time required to transfer the wafers and conduct an additional process reduces the efficiency of chip production. In addition, a machine that can perform wet etching with acid is very expensive, both initially and operationally, thus making the process more expensive and less efficient. Third, transferring fragile wafers to a separate machine while the wafers are at a maximum state of stress increases the probability of damaging the wafers, thereby further reducing efficiency and increasing the cost of production. Fourth, the acids typically used in the etching process are environmentally toxic and difficult to dispose of properly. The cost of the acids, plus the cost of disposing of the acids, make the cost of using an acid wet etch process even more expensive. Thus, a new method for reducing wafer stress has been developed in order to avoid unnecessary damage to the integrated chips on the front side of the wafer, increase efficiency, reduce cost, and reduce environmental pollution.

SUMMARY

The methods and systems described below provide for a more efficient, a less expensive, and easier stress relief process after backgrinding. Instead of using acids to perform stress relief, the wafers are placed onto a spinning platform in a chamber used for the normal rinse step of the backgrinding process. A solution of potassium hydroxide (KOH) is then sprayed onto the substrate side of the wafer while it is spinning. The KOH solution performs the substrate removal necessary to reduce surface stresses in the wafer, while spinning the wafer ensures that the substrate removal is evenly distributed. After spin etching is completed the wafer is rinsed and then moved to the next processing step.

During the etching process, the wafer may be supported on a rotatable chuck adapted to direct the flow of chilled, deionized water underneath the device side of the wafer. The water supports the wafer and protects the front side of the wafer from KOH during the spin-etch process. Preferably, the chuck rotates in order to impart angular momentum to the water. The angular momentum of the water, in turn, imparts angular momentum to the wafer, causing the wafer to spin.

BRIEF DESCRIPTION OF THE DRAWINGS

FIG. 9 shows a chuck adapted to direct the flow of a fluid underneath a wafer disposed on the chuck.

FIG. 10 shows a chuck adapted to direct the flow of a fluid underneath a wafer disposed on the chuck.

FIG. 11 shows a chuck adapted to direct the flow of fluid that supports a wafer.

DETAILED DESCRIPTION OF THE INVENTIONS

Figure 1:
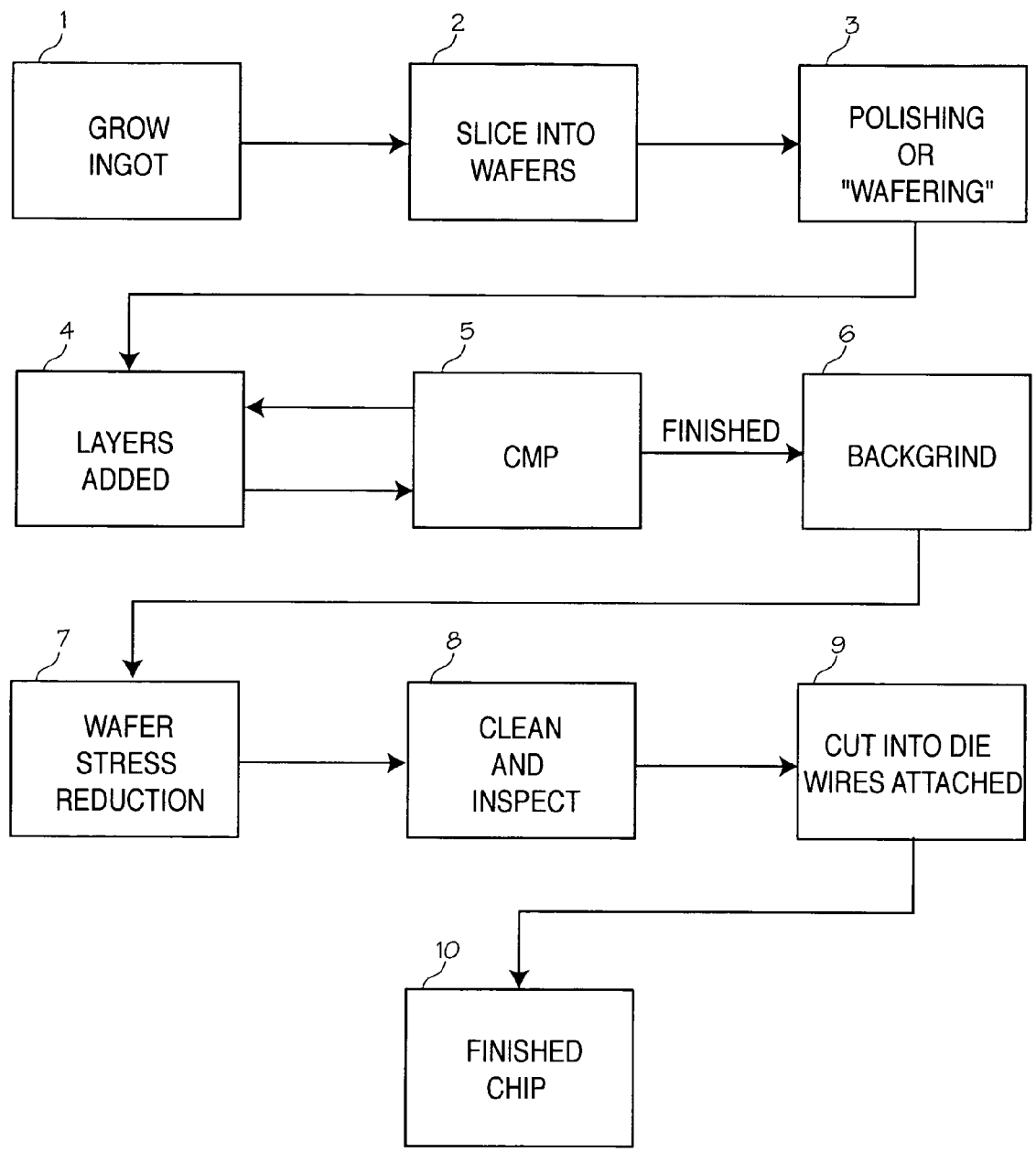
FIG. 1 is a block diagram of a system for producing integrated chips, including the backgrinding step and the step of spin etching the backside of a wafer with an alkali etch solution.

FIG. 1 is a block diagram of a system for producing integrated chips, including the backgrinding step and the step of spin etching the backside of a wafer with an alkali etch solution. In step 1 silicon is purified and cast into electronic-grade ingots. The ingots are then converted into high purity, single crystal silicon by growing a crystal silicon structure. In step 2 the ingot is sliced into wafers using a diamond saw, with each wafer being approximately 1/40" thick. In step 3 each wafer is polished, lapped smooth, damage decorated with acid to reveal hidden defects, and may be ground either over the wafer surface or at its edges. After the polishing processing, also known as wafering, is complete the new prime wafer is ready to have integrated circuits built upon it. In steps 4 and 5, integrated circuits are built onto the front side of the wafer. In step 4 at least one layer of material is deposited onto the silicon wafer substrate. Then, in step 5, a CMP process is applied to the layer in order to ensure a very flat surface, to enhance photolithographic abilities, to improve metal wiring quality, to enhance step coverage, and to realize other advantages. The result is many integrated circuits deposited on a silicon substrate. Steps 4 and 5 are repeated as necessary until the desired number and types of layers are reached and a complicated plurality of integrated circuits is built up on the front side of the wafer. In step 6 the bulk of the silicon substrate is removed from the backside of the wafer in a process known as backgrinding. Backgrinding makes the overall chip thinner, thus allowing better heat dissipation in the finished integrated circuit chip. However, backgrinding adds surface stress to the wafer, thus making the wafer more prone to warping.

In step 7 the wafer is processed to relieve surface stress on the backside of the wafer. In this step, the wafer is spin etched in an alkali etchant. We apply an aqueous solution of potassium hydroxide (KOH), or other base or alkali etch solution, to a spinning wafer in a gaseous environment. The KOH spin etching method removes a sufficient portion of the substrate layer to relieve the stress in the wafer.

In step 8 the newly etched wafer is rinsed and dried. It is also inspected for unwanted defects. In step 9 the wafer is cut into individual die. Each die is an individual integrated circuit chip. Each die is then processed by attaching wires to pre-determined locations on the integrated circuit chip. In step 10 the new integrated circuit chips are tested and then encapsulated into ceramic or plastic enclosures.

Figure 2:
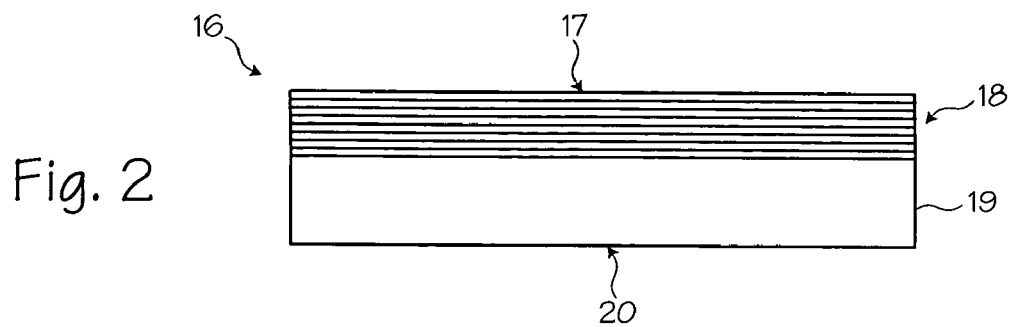
FIG. 2 illustrates a cross section of a silicon wafer upon which a plurality of layers has been deposited.

FIGS. 2 through 4b illustrate the principles of the stress reduction step represented by block 7 in FIG. 1. FIG. 2 illustrates a cross section of a wafer 16 and the front side 17 of a plurality of layers 18 which have been deposited on a silicon substrate 19. The CMP process has made the surface 17 of the wafer 16 planarized and smooth. Backgrinding has removed much of the original thickness from the backside 20 of the silicon substrate 19. However, the physical force used during backgrinding causes surface stress to build up along the bottom surface 20 of the wafer 16.

Figure 3:
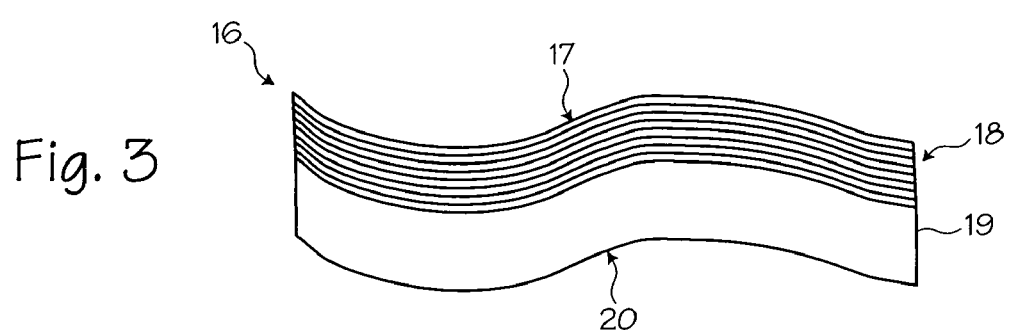
FIG. 3 illustrates the warping that can occur in the wafer of FIG. 2 if the stresses in the wafer are not relieved.

FIG. 3 illustrates the warping that can occur due to these stresses when the silicon substrate 19 and overall wafer 16 become very thin. The bottom surface 20, top surface, 17, and layers 18 become non-planar, rendering the wafer useless for most applications. Spin etching with an aqueous solution of KOH after backgrinding will relieve surface stresses along the bottom surface 20 of the wafer 16 and thereby avoid this warping.

Figure 4A:
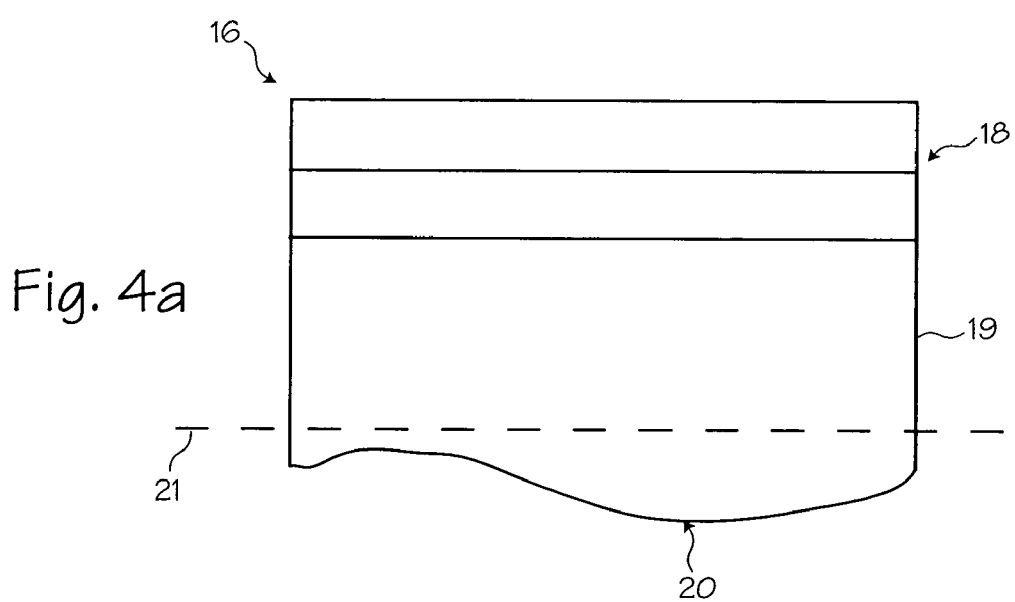
FIG. 4a shows the wafer of FIG. 2 further magnified to illustrate bottom surface warping caused by backgrinding.

FIG. 4a shows a magnified cross-section of the wafer 16 shown in FIG. 2 and illustrates the non-planar bottom surface 20 of the substrate 19 remaining after backgrinding. The warping is reduced by chemically removing a portion of the bottom surface 20. The demarcation line 21 shown in phantom illustrates the portion of substrate that is removed (the portion removed is below the phantom line 21). By removing the irregular surface of the substrate 19 the overall stress in the wafer 16 is reduced. Note that the degree of warping shown is exaggerated in comparison to the total thickness of the wafer. The backgrinding process typically grinds a 700 micrometer (μm) substrate to a thickness of from about 350 μm or 250 μm to about 75 μm. On the other hand, the amount of silicon removed from the back side 20 of the substrate 19 by etching is typically from about 0.1 μm to about 2 μm.

Figure 4B:
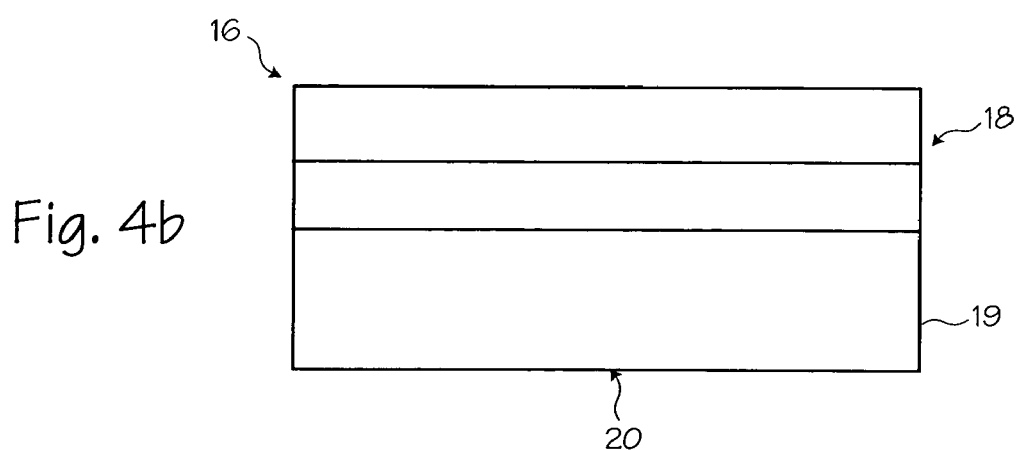
FIG. 4b illustrates the wafer after a portion of the bottom surface of the substrate has been removed.

FIG. 4b illustrates the wafer 16, including the deposited layers 18, after a portion of the bottom surface 20 of the substrate 19 has been chemically removed. The surface stress on the wafer is now greatly reduced. Because one of the major sources of stress has been significantly reduced, the wafer is much more stable and is much more likely to retain its shape.

Figure 5:
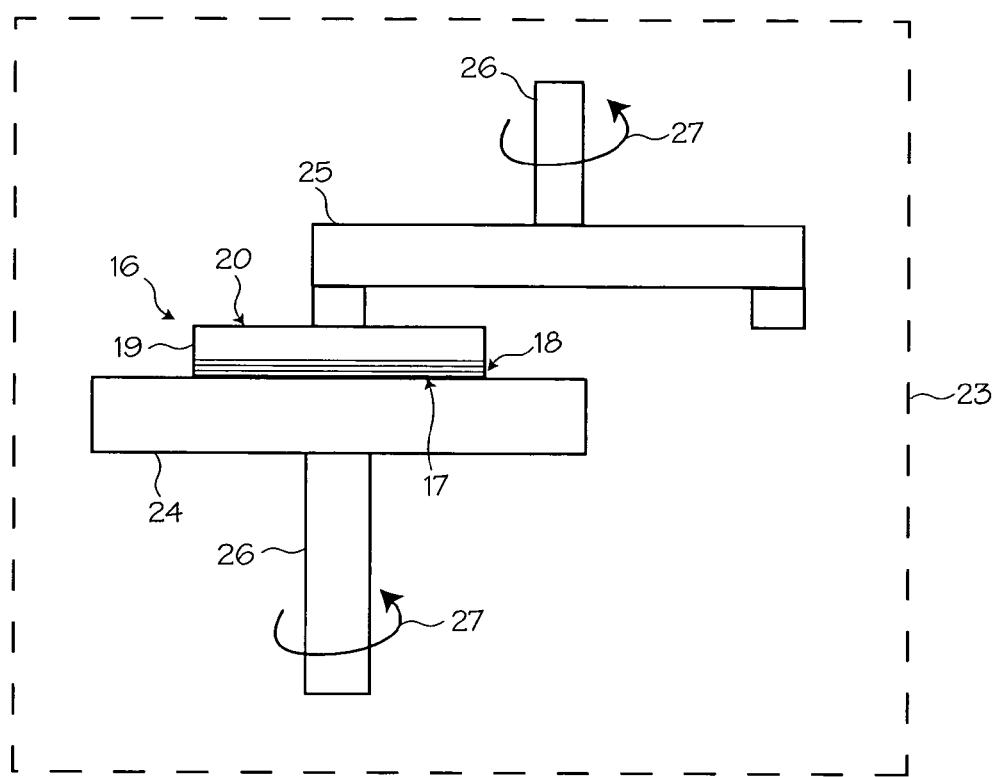
FIG. 5 illustrates the process of backgrinding an integrated chip substrate.
Figure 6:
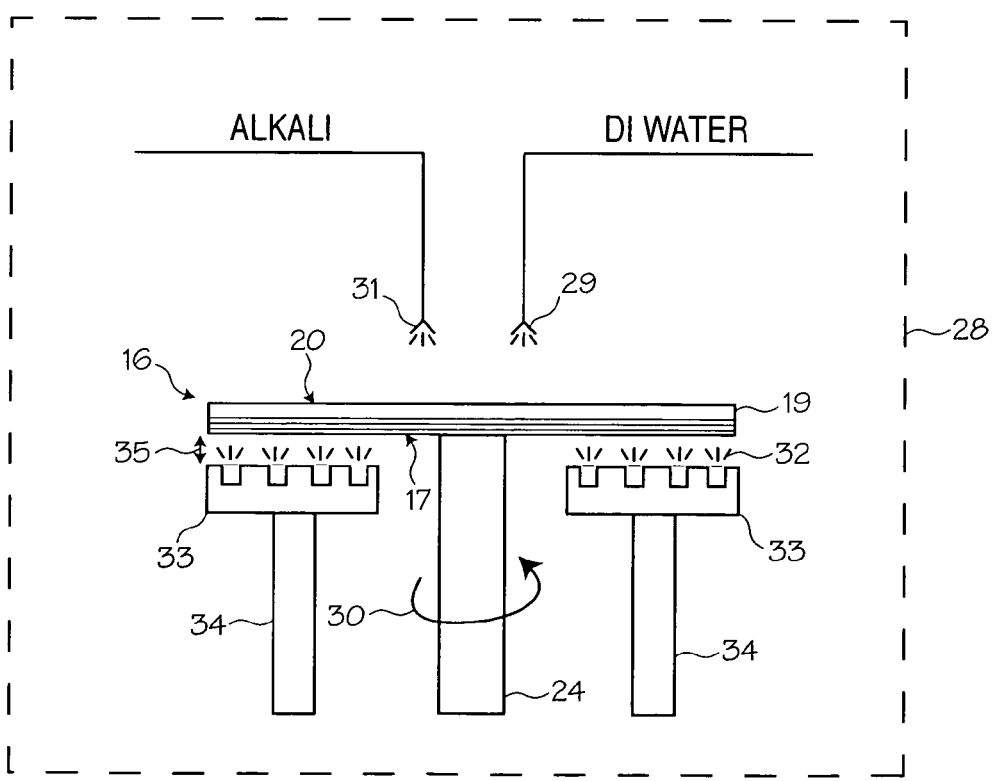
FIG. 6 illustrates the methods and systems used to perform spin etching with an alkali solution to achieve wafer stress relief.
Figure 7:
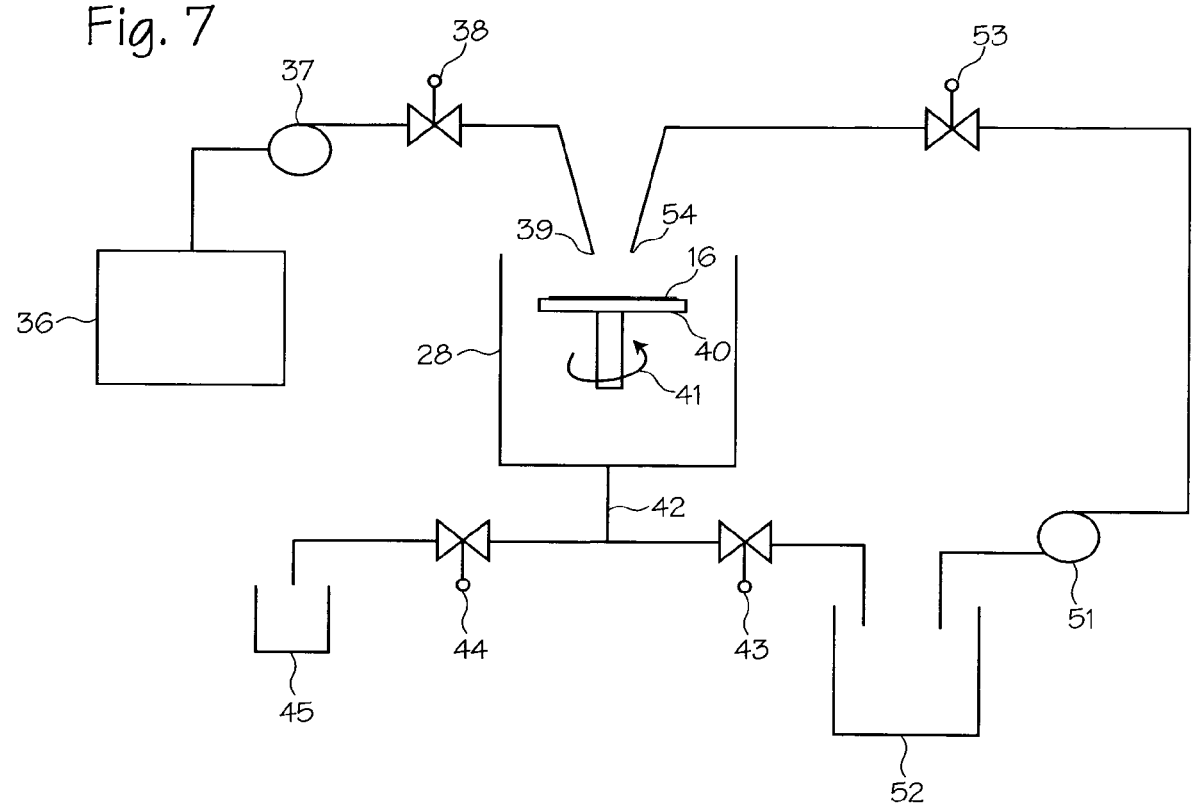
FIG. 7 is a schematic of the rinse station of a modified version of a Strasbaugh 7AF Intelligent Wafer Grinder.

FIGS. 5 through 7 illustrate methods and devices by which a wafer is background and subsequently spin etched with KOH. FIG. 5 illustrates the process of backgrinding an integrated chip substrate 19 in a grinding chamber 23. First, the wafer's front side 17, comprising the multiple layers of deposited material 18, is secured to a work chuck 24 by means of a vacuum. Backgrind tape may be placed on the front side of the wafer to protect it during handling, during the grinding step, and during the etching step. Subsequently, the grinding wheel 25 grinds the back side 20 of the wafer and removes the bulk of the silicon substrate 19 as the work chuck and grind wheel rotate on spindles 26, as shown by arrows 27. After backgrinding, a robotic arm typically transfers the wafer 16 to another work chuck in a separate rinse station.

FIG. 6 illustrates the methods and systems used to perform spin etching with KOH to achieve stress relief. The spin etch process is performed in the same rinse chamber 28 used to rinse the wafer 16 after backgrinding. However, the rinse chamber is coated with Teflon®, or a similar non-reactive or corrosive-resistant material, to protect the chamber from the corrosive effects of KOH.

The center of the front side 17 of the wafer 16 is secured to the relatively narrow work chuck 24 by means of a vacuum. The back side 20 of the wafer is then rinsed with de-ionized water (DI water) 29 while the wafer 16 rotates about the axis of the work chuck 24, as shown by arrow 30. After rinsing, the back side 20 of the wafer is sprayed with a warm alkali etching solution 31, typically KOH, while the wafer 16 continues to rotate. The warm alkali solution removes a portion of the substrate 19, thus relieving stress in the wafer 16. While the alkali solution is applied to the back side 20 of the wafer, the front side 17 of the wafer 16 is simultaneously sprayed with chilled deionized water 32 at a temperature of about 5° Celsius to about 15° Celsius. The chilled deionized water is sprayed from a plurality of nozzles, or injection ports, disposed within an annular nozzle platform 33. The nozzle platform 33 is supported by a support 34. The distance between the nozzle platform 33 and the wafer 16, shown by arrows 35, can vary, but is typically about 1 millimeter. The chilled water keeps the wafer 16 cool, thus protecting it from the relatively high temperature of the alkali solution. Furthermore, the chilled water protects the front side 17 of the wafer 16 from direct contact with the alkali solution.

The bulk of the alkali solution and cooling water is thrown outward by the centrifugal force caused by spinning the wafer and the mixture of waste alkali solution and waste water is drained away into a waste or recycle tank. The rinse station's exhaust system then collects much of the remaining residue of alkali solution thrown from the wafer. After the etching process is complete, both the backside 19 and front side 17 of the wafer 16 are given a secondary rinse of de-ionized water to remove any remaining alkali solution. The wafer 16 is then dried by blowing air from the bottom of the chamber while spinning the wafer at a rate of about 2000 RPM to about 4000 RPM. Finally, the wafer is transferred from the rinse and etch chamber to the next stage of wafer or chip processing.

To remove the required amount of substrate a solution of from about 20% to about 40% of KOH at a temperature of about 55° Celsius to about 85° Celsius (preferably between a temperature of 55° Celsius and 65° Celsius) is sprayed onto the back side 20 of the silicon wafer 16 at a rate of about 100 milliliters per minute (ml/minute) to about 500 ml/minute for about 1 minute to about 5 minutes. In order to ensure that the substrate is chemically removed to an even depth, the silicon wafer is spun at a rate of about 20 RPM to about 500 RPM: typically in the range of about 20 RPM to about 50 RPM. The centrifugal force of spinning causes the KOH solution to spread evenly across the back side 20 of the wafer 16, prevents the KOH from building up in relatively low areas on the substrate, and ensures that relatively high areas on the substrate are worn down preferentially. At the same time that the KOH is applied to the backside 20 of the wafer 16, the front side 17 of the wafer 16 is sprayed with deionized water 32 chilled to a temperature from about 5° Celsius to about 15° Celsius.

As an alternative to using the vacuum chuck described above, the wafer 16 may be secured to a rotatable chuck which supports the entire front side of the wafer, such as the chuck shown in FIG. 5. In this case, the wafer is secured to the chuck with backgrind tape, which may be the same backgrind tape used to secure the wafer during the backgrind process. Thus, it is possible to design a machine that performs the backgrind, rinse, and alkali spin etch steps all in the same chamber of the same machine. Whichever chuck to which the wafer is secured, only the back side 20 of the wafer 16 is exposed to the KOH during the spin etch process. The front side of the wafer is then cooled by directly cooling the chuck in a water bath or by thermal coupling to some other heat sink. In the case of a water bath, the wafer is secured to the chuck by a vacuum while water is circulated underneath the wafer. The circulating water directly contacts the front side of the wafer, though the level of the water is carefully controlled to prevent it from touching the backside of the wafer while spin etching is performed.

Whichever version of the chuck is selected, either that exemplified in FIG. 5 or that exemplified in FIG. 6, the chuck is designed such the wafer 16 need not leave the rinse station chuck 24 between the rinse, spin etch, and secondary rinse steps. Thus, the overall efficiency of the process is increased.

FIG. 7 is a schematic of the rinse station of a modified version of the Strasbaugh 7AF Intelligent Wafer Grinder, a machine used to perform backgrinding and other wafer grinding applications. Although a modified version of the Strasbaugh 7AF Intelligent Wafer Grinder is used to illustrate the methods described below, the methods are not dependent on that machine. The methods could be used in nearly any machine used to rinse wafers. Alternatively, the method could be used in a machine separate from the one used to perform the rinse step, as is typically done for acid etching methods.

After backgrinding, the wafer 16 is rinsed with de-ionized water pumped from a de-ionized water supply, reservoir or tank 36 by a pump 37 through a DI water valve 38 and ultimately through a nozzle 39. The de-ionized water removes small particulates left behind during the grinding process. In order to ensure that all of the particulate matter is rinsed away, the wafer 16 is spun on a platform 40 as shown by arrow 41. The waste water then falls through the rinse station drain 42. The KOH drain valve 43 is closed and the water drain valve 44 is opened so that the waste water drains away into the waste water tank 45.

After the rinse step the KOH drain valve 43 is opened and the water drain valve 44 is closed. Then, KOH is pumped by a pump 51 from a KOH supply, reservoir or tank 52 through a KOH valve 53 and finally through a KOH nozzle 54 onto the spinning wafer 16. The excess KOH flows through the rinse station drain 42 and back into the KOH tank 52 where the KOH is recycled. Waste material etched from the wafer 16 will settle to the bottom of the tank and thus will not interfere with the etching process. Periodically, typically every few days, the KOH tank 52 will be drained and fresh KOH will be placed in the tank 52. Alternatively, the KOH is not recycled. In this case, the KOH is delivered from a separate KOH tank. The waste KOH is then drained through the rinse drain 42, through the KOH drain valve 43 and into a waste tank, where the waste KOH is stored before it is eliminated.

Although using a KOH solution on a spinning wafer is useful to remove a portion of the substrate on thin wafers, the method is also useful in other applications. For example, the method is useful for damage decoration, for etching wafer layers, for removing material on prime wafers, and for revealing hidden defects on prime wafers. The process also is useful on wafers using substrates other than silicon, such as gallium arsenide. In addition, other basic and alkali solutions can be used to perform the spin etch process, such as sodium hydroxide, aqueous ammonia, ammonium hydroxide, alkali metal hydroxides, or organic alkali solutions such as trimethyl ammonium.

Figure 8:
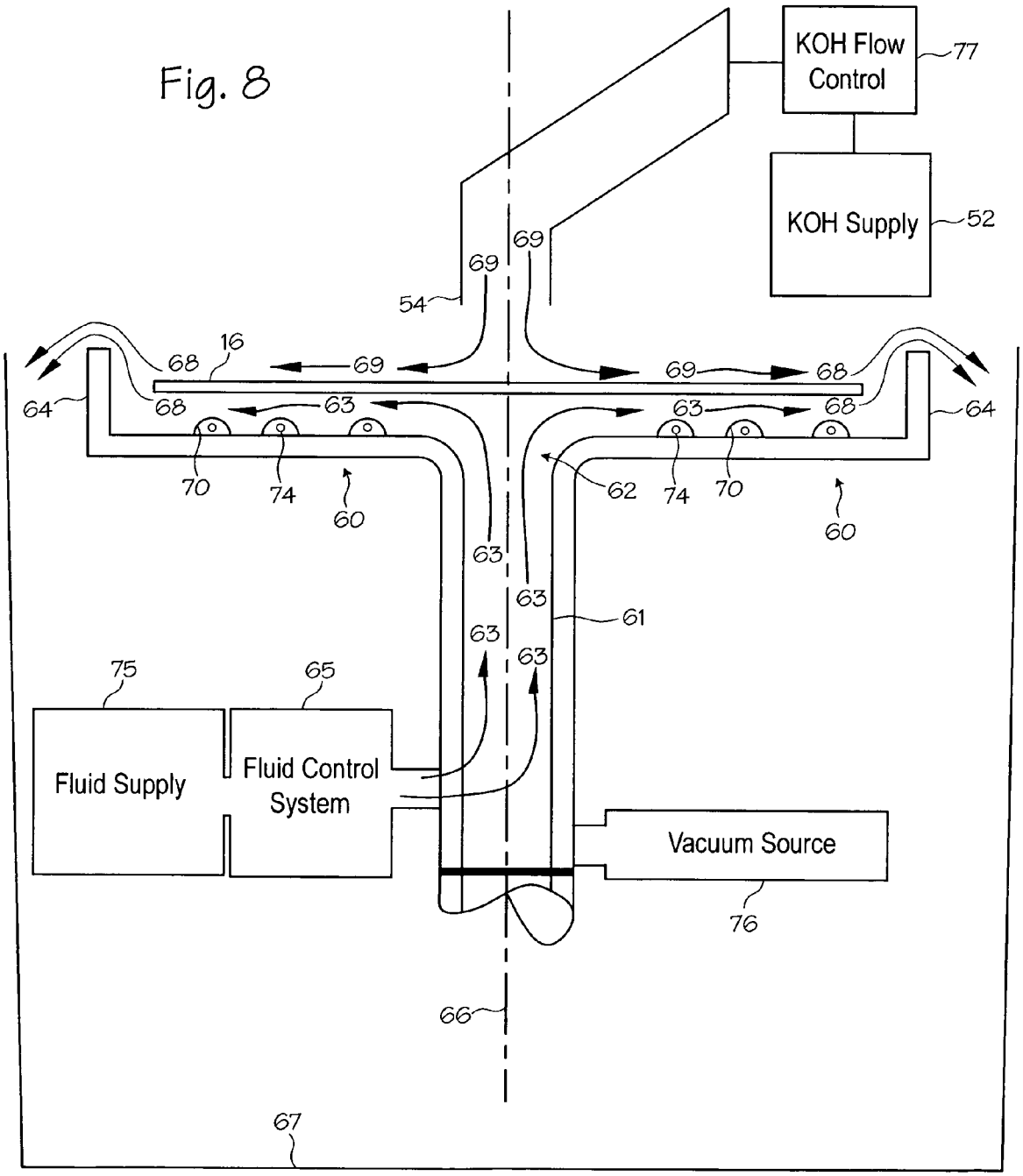
FIG. 8 shows a cross section of a chuck adapted to direct the flow of a fluid underneath a wafer disposed on the chuck.

FIG. 8 shows a chuck 60 adapted to direct the flow of a fluid underneath the device side of a wafer 16 during spin-etching with KOH. The chuck is preferably a Teflon®-coated platform adapted to support a wafer. A fluid supply tube 61 is in fluid communication with an opening 62 disposed in the center of the chuck. Fluid (as shown by arrows 63) flows from a fluid source 75 that is connected by a rotary union to the chuck, through the supply tube and beneath the device side of the wafer.

The chuck is provided with annular sidewalls 64 that limit radial movement of the wafer. (The chuck may therefore be characterized as a pan.) The sidewalls extend axially from the edge of the chuck and may be perpendicular to the surface of the chuck as shown or may extend at an angle with respect to the surface of the chuck. The inner diameter of the sidewalls may be slightly larger than the diameter of the wafer or it may conform closely to the diameter of the wafer.

A fluid control system 65, connected to the chuck via a rotary fluid coupling, controls fluid pressure and fluid flow so that the fluid lifts the wafer from the surface of the chuck and supports the wafer. (The fluid supply may also be connected to the chuck via a rotary fluid coupling.) Fluid pressure and flow is further controlled such that the wafer floats at a height (relative to the surface of the chuck and along axis 66) corresponding to the height of the sidewalls. Thus, KOH flows over the backside of the wafer, over the edge of the wafer and into the fluid supporting the wafer. Because the fluid flows over the edge of the sidewalls, the mixture of KOH and supporting fluid flows over the sidewalls and into a catch basin 67 disposed beneath the chuck (as shown by arrows 68). Thus, the flow of fluid protects the front side of the wafer and the edge of the wafer from the effects of KOH. Perforations may be provided in the sidewalls 64 if desired should KOH dilution at the edge of the wafer prove problematic.

To cause the wafer to spin, the chuck is rotated while the fluid supports the wafer. The rotation of the chuck imparts angular momentum to the fluid, which in turn imparts angular momentum to the wafer and causes the wafer to spin. Another way to cause the wafer to spin is to introduce fluid beneath the wafer such that the fluid initially has an angular momentum relative to the surface of the chuck. In either case, the wafer will spin at a rate suitable for performing the method of spin-etching with KOH.

Preferably, the fluid is de-ionized water chilled to a temperature of about 5° Celsius to about 15° Celsius, though other fluids may be used to support the wafer depending on what is required by the particular manufacturing step. (The temperature of the chilled water may be increased somewhat if the temperature gradient across the wafer would damage the devices built-up on the front side of the wafer.) Chilled deionized water cools the device side of the wafer as warm KOH is pumped onto the backside of the wafer with a KOH flow control system 77 and through a nozzle 54 disposed over the backside of the wafer (as shown by arrows 69). The chilled water prevents thermal damage to the devices built-up on the wafer. (The temperature of the KOH and the exothermic reaction between KOH and silicon together can cause sufficient heat to damage devices built-up on the front side of the wafer.) The chilled water also prevents any backgrinding tape, or other protective substance, disposed on the device side of the wafer from melting or permanently sticking to the devices due to heat. The flow of water also protects the device side of the wafer from KOH and, if backgrinding tape is not used, rinses contaminants that remain on the device side of the wafer.

The surface of the chuck facing the wafer may be provided with bumps 70 upon which the wafer rests when water is not flowing beneath the wafer. The bumps 70 support the wafer 16 when a vacuum, supplied by a vacuum source 76 connected to the chuck via a rotary fluid coupling, is applied through the fluid supply tube. (The vacuum stabilizes or seats the wafer prior to wafer handling.) The bumps thereby allow a thin, fragile wafer to be more easily picked-up from the chuck and subsequently handled. The bumps may be small hemispherical bumps 71, as shown in the chuck 60 of FIG. 9 or annular ridges 72, as shown in the chuck 60 of FIG. 10. The bumps may also be arcuate ridges 73 shaped to resemble a pinwheel, as shown in the chuck 60 of FIG. 11, that channel fluid flow in a manner that aids in rotating the wafer or chuck.

The bumps may also be disposed over the ends of one or more additional fluid supply tubes. Each additional fluid supply tube is in fluid communication with a corresponding aperture or nozzle 74 in the bumps and the supply of fluid 75 and, optionally, the vacuum source 76. In this case, fluid flow sufficient to lift and support the wafer is pumped through the nozzles in the bumps. If the nozzles all face in the clockwise direction or in the counter-clockwise direction, or otherwise have a circumferentially oriented facing relative to the surface of the chuck, then angular momentum will be imparted to the wafer as water is pumped through the nozzles. The fluid supply tubes and nozzles in the bumps may replace the central fluid supply tube and the opening in the chuck.

After the etching process with KOH is complete, the backside of the wafer is rinsed with deionized water. The fluid supporting the wafer is then drained through the opening in the chuck or through the nozzles in the bumps. Subsequently, a vacuum communicated through the opening or through the nozzles holds the wafer to the bumps. Then, the chuck is rotated at high speeds (about 2000 rpm), with the resulting centrifugal force driving any remaining water from the surfaces of the wafer.

Although designed for use with the spin-KOH process described above, the chuck may also be used with other processes that require that the wafer be supported. For example, the chuck may be used with processes that etch the wafer with an acid. Thus, while the preferred embodiments of the devices and methods have been described in reference to the environment in which they were developed, they are merely illustrative of the principles of the inventions. Other embodiments and configurations may be devised without departing from the spirit of the inventions and the scope of the appended claims.

I claim:

1. A system for supporting a wafer with a fluid, said system comprising:

a rotatable chuck adapted to support a wafer, said chuck having an axis, a surface upon which a wafer may rest, an edge, a sidewall extending axially from the edge of the chuck and an opening disposed on the surface of the chuck;

a fluid supply tube in fluid communication with the opening;

a supply of fluid in fluid communication with the fluid supply tube;

a fluid control system operable to control the flow of fluid over the surface of the chuck; and a supply of KOH and a KOH flow control system operably connected to the supply of KOH, said KOH flow control system operable to pump KOH onto a backside of the wafer when the wafer is supported on the chuck.

2. The system of claim 1 wherein the fluid control system and the fluid supply tube are adapted such that fluids flowing over the surface of the chuck have a circumferentially directed angular momentum sufficient to cause a wafer disposed on the chuck to spin.

3. The system of claim 1 further comprising at least one bump adapted to support a wafer, said bump disposed on the chuck.

4. The system of claim 1 further comprising a nozzle disposed above the chuck, said nozzle in fluid communication with a supply of KOH, and a means for controlling the flow of KOH through the nozzle.

5. The system of claim 4 wherein the fluid is deionized water chilled to a temperature between about 5° Celsius and about 15° Celsius.

6. The system of claim 1 further comprising a vacuum source in fluid communication with the fluid supply tube.

7. A system for supporting a wafer with a fluid, said system comprising:

a chuck having an axis, a surface, an edge and a sidewall extending axially from the edge of the chuck;

a bump disposed on the chuck, said bump extending axially from the surface of the chuck and said bump being adapted to support a wafer;

a nozzle disposed in the bump;
a fluid supply tube in fluid communication with the nozzle;
a supply of fluid in fluid communication with the fluid supply tube; and
a fluid control system operable to control the flow of fluid through the nozzle.

8. The system of claim 7 wherein the nozzle is a circumferentially facing nozzle.

9. The system of claim 7 further comprising a second nozzle disposed above the chuck, said second nozzle in fluid communication with a supply of KOH, and a means for controlling the flow of KOH through the second nozzle.

10. The system of claim 9 wherein the fluid is deionized water chilled to a temperature between about 5° Celsius and about 15° Celsius.

* * * * *